US010483947B2

(12) United States Patent
Lo et al.

(10) Patent No.: US 10,483,947 B2
(45) Date of Patent: Nov. 19, 2019

(54) ANTI-ALIASING FILTER

(71) Applicant: MEDIATEK Inc., Hsinchu (TW)

(72) Inventors: Tien-Yu Lo, Hsinchu (TW);
Chan-Hsiang Weng, Hsinchu (TW);
Patrick Cooney, San Jose, CA (US);
Tsung-Kai Kao, San Jose, CA (US);
Stacy Ho, San Jose, CA (US)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 16/157,165

(22) Filed: Oct. 11, 2018

(65) Prior Publication Data

US 2019/0288672 A1 Sep. 19, 2019

Related U.S. Application Data

(60) Provisional application No. 62/642,656, filed on Mar. 14, 2018.

(51) Int. Cl.
*H03H 17/04* (2006.01)
*H03F 3/45* (2006.01)

(52) U.S. Cl.
CPC .... *H03H 17/0416* (2013.01); *H03H 17/0461* (2013.01); *H03F 3/45* (2013.01); *H03F 2200/129* (2013.01); *H03F 2200/156* (2013.01); *H03F 2203/45116* (2013.01); *H03F 2203/45514* (2013.01)

(58) Field of Classification Search
None
See application file for complete search history.

(56) References Cited

U.S. PATENT DOCUMENTS

| 4,567,465 A | * | 1/1986 | Komiya | H03M 1/52 |
| | | | | 341/168 |
| 4,633,425 A | | 12/1986 | Senderowicz et al. | |
| 4,893,088 A | * | 1/1990 | Myers | H03F 1/303 |
| | | | | 327/336 |

(Continued)

FOREIGN PATENT DOCUMENTS

| EP | 2259426 A1 | 12/2010 |
| JP | 3872613 B2 | 10/2006 |

OTHER PUBLICATIONS

Tohidian, et al: "A 2mW 800MS/s 7th-Order Discrete-Time IIR Filter with 400kHz-to-30MHz BW and 100dB Stop-Band Rejection in 65nm CMOS"; ISSCC 2013 / Session 10 / Analog Techniques / 10.2; pp. 173-175.

Mirzaei, et al.: "Analysis of First-Order Anti-Aliasing Integration Sampler"; IEEE Transactions on Circuits and Systems—I: Regular Papers, vol. 55, No. 10, Nov. 2008; pp. 2994-3005.

(Continued)

*Primary Examiner* — Jeffery S Zweizig
(74) *Attorney, Agent, or Firm* — McClure, Qualey & Rodack, LLP

(57) ABSTRACT

The invention provides an anti-aliasing filter (AAF) for discretization at a sampling period. The AAF may include an operational amplifier having an input terminal and an output terminal, a first capacitor coupled between the input terminal and the output terminal, a second capacitor, and a first switch coupled between the first capacitor and the second capacitor. During a first phase, the first switch may conduct the second capacitor to the first capacitor. During a second phase, the first switch may stop conducting the second capacitor to the first capacitor. The first phase may last for one said sampling period.

24 Claims, 5 Drawing Sheets

(56) References Cited

U.S. PATENT DOCUMENTS

| | | | | |
|---|---|---|---|---|
| 6,630,860 | B1 * | 10/2003 | Anumula | H03H 11/1291 |
| | | | | 327/308 |
| 7,239,183 | B2 * | 7/2007 | Ruha | G11C 27/026 |
| | | | | 327/95 |
| 7,719,348 | B2 * | 5/2010 | Ullmann | H03H 19/004 |
| | | | | 327/337 |
| 7,990,209 | B2 * | 8/2011 | Romero | H03H 19/004 |
| | | | | 327/556 |
| 8,970,293 | B1 | 3/2015 | Salvi et al. | |
| 9,106,208 | B2 | 8/2015 | Visconti et al. | |
| 9,857,932 | B2 * | 1/2018 | Erdogan | G06F 3/0416 |
| 10,141,941 | B2 * | 11/2018 | Petrov | H02M 3/07 |
| 2004/0196936 | A1 | 10/2004 | Kawama et al. | |
| 2013/0285767 | A1 | 10/2013 | Visconti et al. | |

OTHER PUBLICATIONS

Schreier, et al.: "Understanding Delta-Sigma Data Converters"; Originally published 2005.

TIPO Office Action dated May 21, 2019, TW Application # 108103078, pp. 1-9.

Krauns, Christian, European Patent Office, dated May 19, 2014 in Munich, Germany, pp. 1-13.

Authors, et al. "Anti-Alias Filter with Zeroes at Multiples of the Sampling Frequency," ip.com Journal, IP Com Inc., West Henrietta, NY, US, Jul. 9, 2003, IP013010424, ISSN:1533-0001. pp. 1-9.

Ahengahong Gao, et al"Anti-Aliasing Filter Circuit Design for Active Power Filter"(IHMSC), (Aug. 26, 2010), P-147-150, ISBN:978-Jan. 4244-7869-9, pps. 1-4.

\* cited by examiner

ANTI-ALIASING FILTER

This application claims the benefit of U.S. provisional application Ser. No. 62/642,656, filed Mar. 14, 2018, the subject matter of which is incorporated herein by reference.

FIELD OF THE INVENTION

The invention relates to anti-aliasing filter (AAF), and more particularly, to AAF including window-sampling switches and operational amplifier with closed-loop feedback to achieve desired filter roll-off, spectrum notches at integer multiplications of sampling frequency, and improved linearity and dynamic range.

BACKGROUND OF THE INVENTION

In signal processing, it is essential to convert a continuous-time analog signal to a discrete-time digital signal by sampling and quantization, so the resultant digital signal may be processed by digital signal processing.

However, sampling an analog signal at a sampling frequency will cause undesired spectrum repetitions to appear at integer multiplications of the sampling frequency, and the spectrum repetitions will cause alias. To address the issues, an AAF is utilized before sampling.

To suppress the issues due to sampling, a signal transfer function of an AAF is expected to be low-pass with well-controlled roll-off, and to have notches at integer multiplications of the sampling frequency. However, it is difficult for traditional continuous-time filter to have such notches without suffering from side effects.

SUMMARY OF THE INVENTION

It is therefore an objective of the present invention to provide an AAF for discretization at a sampling period to solve the above-mentioned problems.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
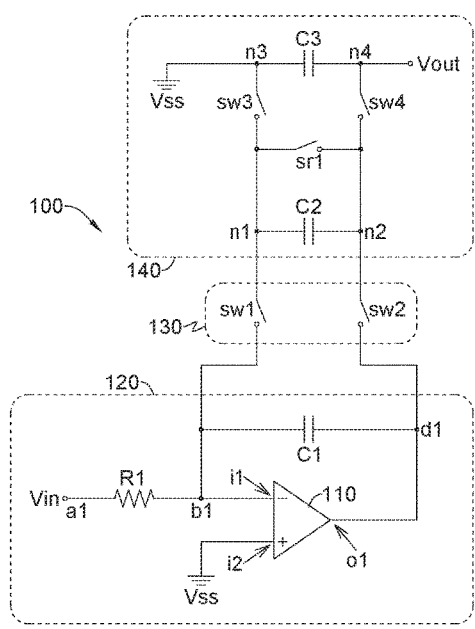
FIG. 1a illustrates an AAF according to an embodiment of the invention.

Please refer to FIG. 1a illustrating an AAF 100 according to an embodiment of the invention. The AAF 100 may filter a signal Vin at a node a1 to a signal Vout at a node n4, so the filtered signal Vout may be further discretized (sampled) at a sampling period Ts, which is a reciprocal of a sampling frequency fs. The AAF 100 may include an operational amplifier 110, a resistor R1, capacitors C1, C2 and C3, and switches sw1 to sw4 and sr1.

The operational amplifier 110 may have a negative input terminal i1 at a node b1, a positive input terminal i2 tied to a voltage Vss (e.g., a ground voltage), and an output terminal o1 at a node d1. The capacitor C1 may be coupled between the input terminal i1 and the output terminal o1 respectively at the nodes b1 and d1. The capacitor C2 may be coupled between nodes n1 and n2. The switch sw1 may be coupled between the capacitors C1 and C2 respectively at the nodes b1 and n1, and the switch sw2 may be coupled between the nodes d1 and n2. The switch sr1 (as a reset switch) may be coupled between two plates of the capacitor C2 respectively at the nodes n1 and n2. The capacitor C3 may be coupled between nodes n3 and n4. The switch sw3 may be coupled between the capacitors C2 and C3 respectively at the nodes n1 and n3, and the switch sw4 may be coupled between the nodes n2 and n4. The resistor R1 may be coupled between the nodes a1 and b1. The node n3 may further be coupled to the voltage Vss.

Figure 1B:
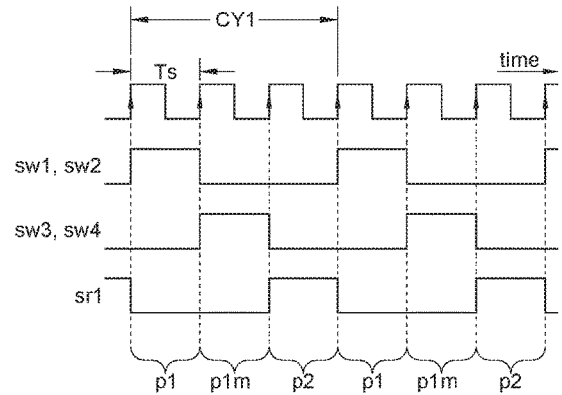
FIG. 1b illustrates an embodiment of an operation timing of the AAF in FIG. 1.

Along with FIG. 1a, please refer to FIG. 1b illustrating an operation timing of the AAF 100 according to an embodiment of the invention. The AAF 100 may work by periodically repeating a cycle CY1, and the cycle CY1 may include three sequential phases p1, p1m and p2. During the phase p1, the switches sw1 and sw2 may conduct the capacitor C2 to the capacitor C1; i.e., the switch sw1 may conduct the nodes n1 to b1, and the switch sw2 may conduct the nodes n2 to d1. Thus, during the phase p1, charge sharing may occur between the capacitors C1 and C2. On the other hand, during the phases p1m and p2, the switches sw1 and sw2 may stop conducting the capacitor C2 to the capacitor C1, so as to insulate the capacitor C2 from the capacitor C1.

During the phase p1m between the phases p1 and p2, the switches sw3 and sw4 may conduct the capacitor C3 to the capacitor C2, so charge sharing may occur between the capacitors C2 and C3. On the other hand, during the phases p1 and p2, the switches sw3 and sw4 may stop conducting the capacitor C3 to the capacitor C2, so as to insulate the capacitor C3 from the capacitor C2.

During the phase p2, the switch sr1 may conduct between the two plates of the capacitor C2; i.e., the switch sr1 may conduct the nodes n2 to n1. Thus, during the phase p2, charges in the capacitor C2 may be reset. On the other hand, during the phases p1 and p1m, the switch sr1 may stop conducting between the two plates of the capacitor C2.

In an embodiment, the phase p1 may last for one sampling period Ts. In an embodiment, the phase p1m may last for one sampling period Ts. In an embodiment, the phase p2 may last for one sampling period Ts.

In the AAF 100, combination of the resistor R1, the capacitor C1 and the operational amplifier 110 may be considered as an analog filter 120 with closed-loop feedback, while combination of the capacitors C2 and C3 and the switches sr1, sw3 and sw4 may be considered as another filter 140, such as a second-order IIR filter. On the other hand, the switches sw1 and sw2 may be considered as a switch circuit 130 coupled between the filters 120 and 140. During the phase p1, the switch circuit 130 may conduct the filter 140 to the input terminal i1 and the output terminal o1. During the phases p1m and p2, the switch circuit 130 may insulate the filter 140 from the input terminal i1 and the output terminal o1.

Figure 4:
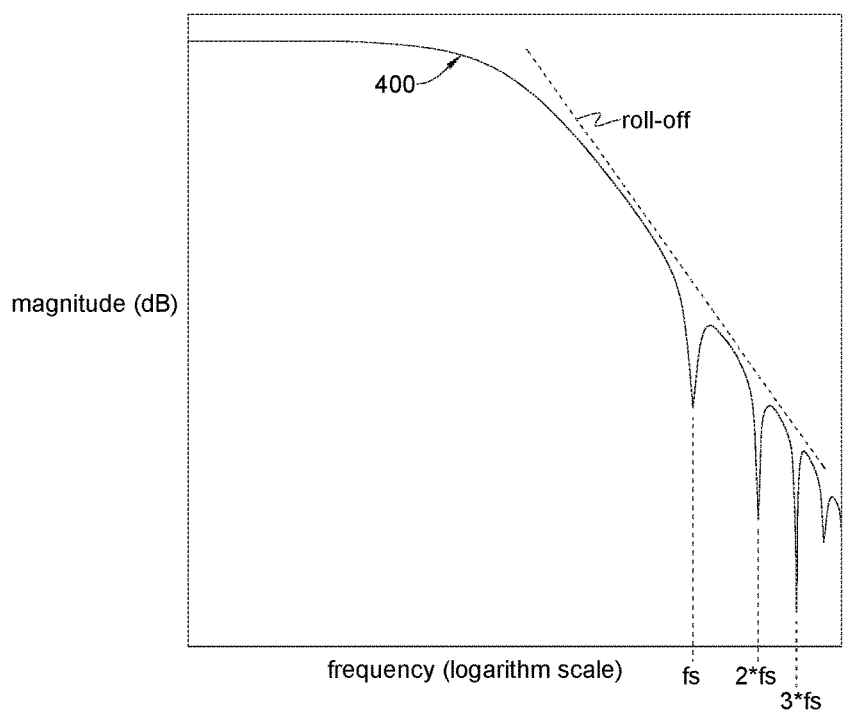
FIG. 4 illustrates an example of a frequency response achievable by the AAF shown in FIG. 1a, 2a or 3.

By switching operation of the switch circuit 130, signal of the filter 120 may be window-sampled to the filter 140, so the AAF 100 may achieve desired signal transfer function, including designated roll-off and notches at integer multiplications of the sampling frequency fs. For example, a signal transfer function of the AAF 100 may be similar to a transfer function 400 shown in FIG. 4; the transfer function 400 may achieve roll-off of 40 dB per decade, and have notches at integer multiplications of the sampling frequency fs, such as fs, 2*fs and 3*fs, etc.

Figure 2A:
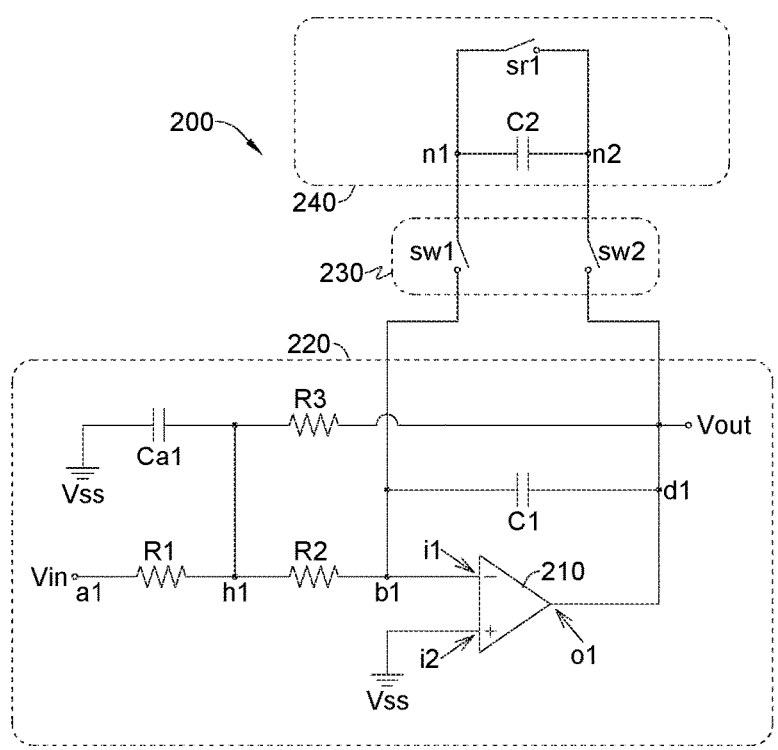
FIG. 2a illustrates an AAF according to an embodiment of the invention.

Please refer to FIG. 2a illustrating an AAF 200 according to an embodiment of the invention. The AAF 200 may filter a signal Vin at a node a1 to a signal Vout at a node d1, so the filtered signal Vout may be further discretized (sampled) at a sampling period Ts, which is a reciprocal of a sampling frequency fs. The AAF 200 may include an operational amplifier 210, resistors R1, R2 and R3, capacitors C1, C2 and Ca1, and switches sw1, sw2 and sr1.

The operational amplifier 210 may have a negative input terminal i1 at a node b1, a positive input terminal i2 tied to a voltage Vss, and an output terminal o1 at the node d1. The capacitor C1 may be coupled between the input terminal i1 and the output terminal o1 respectively at the nodes b1 and d1. The capacitor C2 may be coupled between nodes n1 and n2. The switch sw1 may be coupled between the capacitors C1 and C2 respectively at the nodes b1 and n1, and the switch sw2 may be coupled between the nodes d1 and n2. The switch sr1 may be coupled between two plates of the capacitor C2 respectively at the nodes n1 and n2. The resistor R1 may be coupled between the node a1 and a node h1, the resistor R2 may be coupled between the nodes h1 and b1, and the resistor R3 may be coupled between the nodes h1 and d1. The capacitor Ca1 may be coupled between the voltage Vss and the node h1.

Figure 2B:
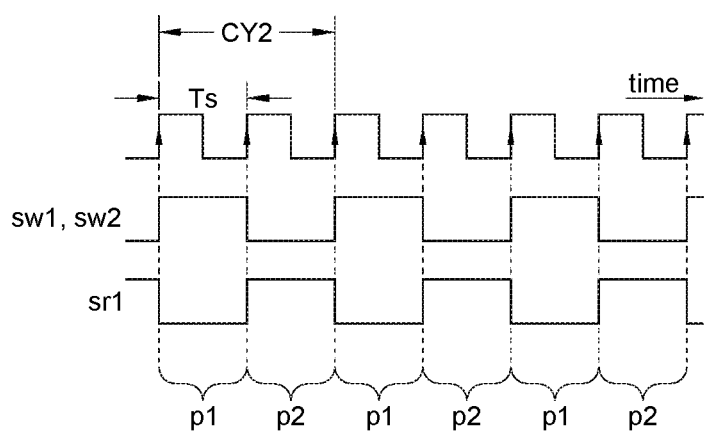
FIG. 2b illustrates an embodiment of an operation timing of the AAF in FIG. 2.

Along with FIG. 2a, please refer to FIG. 2b illustrating an operation timing of the AAF 200 according to an embodiment of the invention. The AAF 200 may work by periodically repeating a cycle CY2, and the cycle CY2 may include two sequential phases p1 and p2. During the phase p1, the switches sw1 and sw2 may conduct the capacitor C2 to the capacitor C1; i.e., the switch sw1 may conduct the nodes n1 to b1, and the switch sw2 may conduct the nodes n2 to d1. Thus, during the phase p1, charge sharing may occur between the capacitors C1 and C2. On the other hand, during the phase p2, the switches sw1 and sw2 may stop conducting the capacitor C2 to the capacitor C1, so as to insulate the capacitor C2 from the capacitor C1.

During the phase p2, the switch sr1 may conduct between the two plates of the capacitor C2; i.e., the switch sr1 may conduct the nodes n2 to n1. Thus, during the phase p2, charges in the capacitor C2 may be reset. On the other hand, during the phase p1, the switch sr1 may stop conducting between the two plates of the capacitor C2.

In an embodiment, the phase p1 may last for one sampling period Ts. In an embodiment, the phase p2 may last for one sampling period Ts.

In the AAF 200, the resistors R1 to R3, the capacitor C1 and Ca1, and the operational amplifier 210 may cooperate as an analog filter 220 with closed-loop feedback, while the capacitor C1 and the switches sr1 may be considered as another filter 240, such as a first-order IIR filter. On the other hand, the switches sw1 and sw2 may be considered as a switch circuit 230 coupled between the filters 220 and 240. During the phase p1, the switch circuit 230 may conduct the filter 240 to the input terminal i1 and the output terminal o1. During the phase p2, the switch circuit 230 may insulate the filter 240 from the input terminal i1 and the output terminal o1. By switching operation of the switch circuit 230, signal of the filter 220 may be window-sampled to the filter 240, so the AAF 200 may achieve desired signal transfer function, including designated roll-off and notches at integer multiplications of the sampling frequency fs. For example, a signal transfer function of the AAF 200 may be similar to the transfer function 400 shown in FIG. 4.

Figure 3:
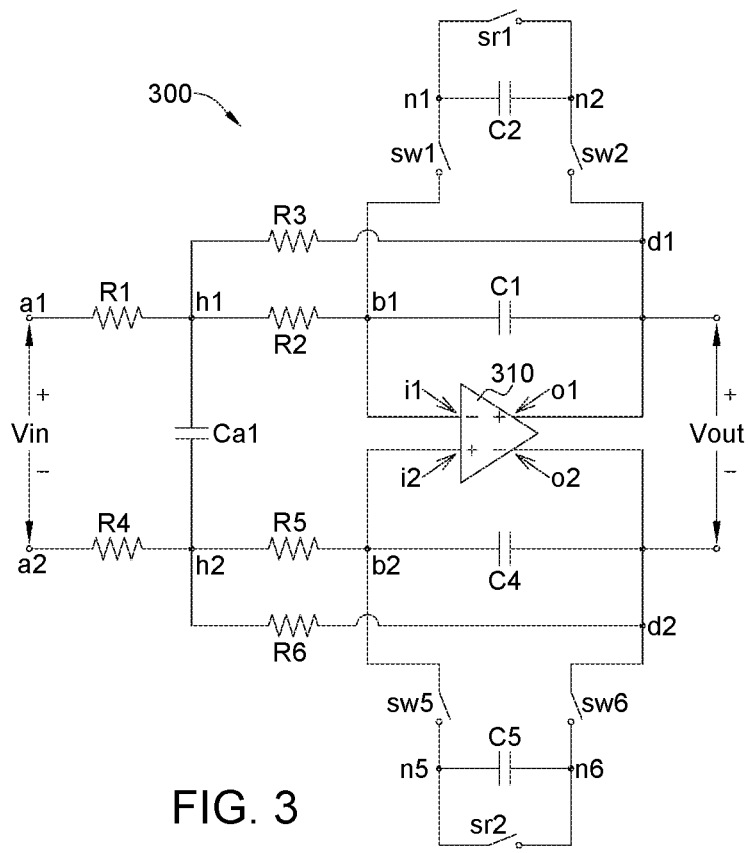
FIG. 3 illustrates an AAF according to an embodiment of the invention.

The signals Vin and Vout in the AAF 100 (FIG. 1a) and the AAF 200 (FIG. 2a) may be single-ended signals. However, both the AAF 100 and the AAF 200 may be augmented to handle differential signals. For example, based on the AAF 200 in FIG. 2a, an AAF 300 in FIG. 3 may be developed for filtering a differential signal Vin to a differential signal Vout. As shown in FIG. 3, the signal Vin may be a differential signal between nodes a1 and a2, and the signal Vout may be a differential signal between nodes d1 and d2. The AAF 300 may include an operational amplifier 310, resistors R1 to R6, capacitors C1, C2, C4, C5 and Ca1, and switches sw1, sw2, sw5, sw6, sr1 and sr2.

The operational amplifier 310 may have a negative input terminal i1 at a node b1, a positive input terminal i2 at a node b2, a positive output terminal o1 at the node d1, and a negative output terminal at the node d2. The capacitor C1 may be coupled between the input terminal i1 and the output terminal o1 respectively at the nodes b1 and d1. The capacitor C2 may be coupled between nodes n1 and n2. The capacitor C4 may be coupled between the input terminal i2 and the output terminal o2 respectively at the nodes b2 and d2. The capacitor C5 may be coupled between nodes n5 and n6. The capacitors C1 and C4 may be matched, and the capacitors C2 and C5 may be matched.

The switch sw1 may be coupled between the capacitors C1 and C2 respectively at the nodes b1 and n1, and the switch sw2 may be coupled between the nodes d1 and n2. The switch sr1 may be coupled between two plates of the capacitor C2 respectively at the nodes n1 and n2. The switch sw5 may be coupled between the capacitors C4 and C5 respectively at the nodes b2 and n5, and the switch sw6 may be coupled between the nodes d2 and n6. The switch sr2 may be coupled between two plates of the capacitor C5 respectively at the nodes n5 and n6.

The resistor R1 may be coupled between the node a1 and a node h1, the resistor R2 may be coupled between the nodes h1 and b1, and the resistor R3 may be coupled between the nodes h1 and d1. The resistor R4 may be coupled between the node a2 and a node h2, the resistor R5 may be coupled between the nodes h2 and b2, and the resistor R6 may be coupled between the nodes h2 and d2. The capacitor Ca1 may be coupled between the nodes h1 and h2. The resistors R1 and R4 may be matched, the resistors R2 and R5 may be matched, and the resistors R3 and R6 may be matched.

Similar to the AAF 200 in FIG. 2a, the AAF 300 in FIG. 3 may work by periodically repeating the cycle CY2 in FIG. 2b, with the switches sw5 and sw6 switching in synchronization with the switches sw1 and sw2, and the switch sr2 switching in synchronization with the switch sri1. During the phase p1, the switches sw1 and sw2 may conduct the capacitor C2 to the capacitor C1, and the switches sw5 and sw6 may conduct the capacitor C5 to the capacitor C4; i.e., the switch sw5 may conduct the nodes n5 to b2, and the switch sw6 may conduct the nodes n6 to d2. Thus, during the phase p1 of the cycle CY2, charge sharing between the capacitors C1 and C2 may occur, and charge sharing between the capacitors C4 and C5 may occur. On the other hand, during the phase p2, the switches sw1 and sw2 may stop conducting the capacitor C2 to the capacitor C1, and the switches sw5 and sw6 may stop conducting the capacitor C5 to C4, so as to insulate the capacitor C5 from the capacitor C4.

During the phase p2 of the cycle CY2, the switch sr1 may conduct between the two plates of the capacitor C2, and the switch sr2 may conduct between the two plates of the capacitor C5; i.e., the switch sr2 may conduct the nodes n6 to n5. Thus, during the phase p2, charges in the capacitor C2 may be reset, and charges in the capacitor C5 may also be reset. On the other hand, during the phase p1, the switch sr1 may stop conducting between the two plates of the capacitor C2, and the switch sr2 may stop conducting between the two plates of the capacitor C5. In an embodiment, the phase p1 may last for one sampling period Ts. In an embodiment, the phase p2 may last for one sampling period Ts. Similar to the AAF 200 in FIG. 2a, the AAF 300 in FIG. 3 may achieve a signal transfer function similar to the transfer function shown in FIG. 4.

To sum up, the AAF according to the invention may include a discrete-time filter, a window-sampling switch circuit and an analog filter formed by single operational amplifier with closed-loop feedback. Therefore, the AAF according to the invention may achieve desired filtering roll-off, and may further achieve notches at integer multiplication of sampling frequency, so as to satisfy demands of anti-alias filtering. Besides, the closed-loop feedback topology may support wider swing of input signal (e.g., Vin in FIG. 1a, 2a or 3) and output signal (e.g., Vout), and thus may achieve wider dynamic range. For example, the operational amplifier associated with the closed-loop feedback may be a rail-to-rail operational amplifier. Moreover, the closed-loop feedback topology with the operational amplifier may achieve much better linearity than open-loop gm-C topology with transconductance amplifier.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An anti-aliasing filter (AAF) for discretization at a sampling period, comprising:
    an operational amplifier having an input terminal and an output terminal;
    a first capacitor coupled between the input terminal and the output terminal;
    a second capacitor; and
    a first switch coupled between the first capacitor and the second capacitor; wherein:
    during a first phase, the first switch conducts the second capacitor to the first capacitor;
    during a second phase, the first switch stops conducting the second capacitor to the first capacitor; and
    the first phase lasts for one said sampling period, such that a signal transfer function of the AAF has one or more notches at one or more integer multiplications of a sampling frequency, with the sampling frequency being a reciprocal of said sampling period.

2. The AAF of claim 1 further comprising a first resistor and a second switch, wherein the first resistor is coupled between a front node and the input terminal, the second capacitor is coupled between a first node and a second node, the first switch is coupled between the first node and the input terminal, and the second switch is coupled between the second node and the output terminal.

3. The AAF of claim 1 further comprising a reset switch coupled between two plates of the second capacitor, wherein:
    during the second phase, the reset switch conducts between the two plates of the second capacitor; and
    during the first phase, the reset switch stops conducting between the two plates of the second capacitor.

4. The AAF of claim 1 further comprising:
    a third capacitor; and
    a third switch coupled between the third capacitor and the second capacitor; wherein:
    during a middle phase between the first phase and the second phase, the third switch conducts the third capacitor to the second capacitor; and
    during the first phase and the second phase, the third switch stops conducting the third capacitor to the second capacitor.

5. The AAF of claim 4, wherein:
    during the middle phase, the first switch stops conducting the second capacitor to the first capacitor.

6. The AAF of claim 4 further comprising a fourth switch, wherein the third capacitor is coupled between a third node and a fourth node, the third switch is coupled between the first node and the third node, and the fourth switch is coupled between the second node and the fourth node.

7. The AAF of claim 4, wherein the middle phase lasts for one said sampling period.

8. The AAF of claim 1 further comprising a first resistor coupled between a front node and the input terminal.

9. The AAF of claim 8 further comprising a second resistor and a third resistor; wherein:
    the first resistor is coupled between the front node and an intermediate node;
    the second resistor is coupled between the intermediate node and the input terminal; and
    the third resistor is coupled between the intermediate node and the output terminal.

10. The AAF of claim 9 further comprising an additional capacitor coupled to the intermediate node.

11. The AAF of claim 1, wherein:
    the operational amplifier further has a second input terminal and a second output terminal; and
    the AAF further comprises:
    a fourth capacitor coupled between the second input terminal and the second output terminal;
    a fifth capacitor; and
    a fifth switch coupled between the fourth capacitor and the fifth capacitor; wherein:
    during the first phase, the fifth switch conducts the fifth capacitor to the fourth capacitor; and
    during the second phase, the fifth switch stops conducting the fifth capacitor to the fourth capacitor.

12. The AAF of claim 11 further comprising a sixth switch, wherein the fifth capacitor is coupled between a fifth node and a sixth node, the fifth switch is coupled between the fifth node and the second input terminal, and the sixth switch is coupled between the sixth node and the second output terminal.

13. The AAF of claim 11 further comprising a second reset switch coupled between two plates of the fifth capacitor, wherein:
    during the second phase, the second reset switch conducts between the two plates of the fifth capacitor; and during the first phase, the second reset switch stops conducting between the two plates of the fifth capacitor.

14. The AAF of claim 11 further comprising:
a first resistor coupled between a front node and the input terminal; and
a fourth resistor coupled between a second front node and the second input terminal.

15. The AAF of claim 14 further comprising a second resistor, a third resistor, a fifth resistor and a sixth resistor, wherein:
the first resistor is coupled between the front node and an intermediate node;
the second resistor is coupled between the intermediate node and the input terminal; and
the third resistor is coupled between the intermediate node and the output terminal;
the fourth resistor is coupled between the second front node and a second intermediate node;
the fifth resistor is coupled between the second intermediate node and the second input terminal; and
the sixth resistor is coupled between the second intermediate node and the second output terminal.

16. The AAF of claim 14 further comprising an additional capacitor coupled between the intermediate node and the second intermediate node.

17. The AAF of claim 1, wherein the second phase lasts for one said sampling period.

18. An AAF for discretization at a sampling period, comprising:
a first filter comprising an operational amplifier which has an input terminal and an output terminal;
a second filter comprising a capacitor; and
a switch circuit coupled between the first filter and the second filter; wherein:
during a first phase, the switch circuit conducts the second filter to the input terminal and the output terminal;
during a second phase, the switch circuit insulates the second filter from the input terminal and the output terminal; and
the first filter further comprises a first resistor coupled between a front node and the input terminal.

19. The AAF of claim 18, wherein the first filter is an analog filter.

20. The AAF of claim 18, wherein the second filter is an IIR (infinite impulse response) filter.

21. An anti-aliasing filter (AAF) for discretization at a sampling period, comprising:
an operational amplifier having an input terminal and an output terminal;
a first capacitor coupled between the input terminal and the output terminal;
a second capacitor; and
a first switch coupled between the first capacitor and the second capacitor; wherein:
during a first phase, the first switch conducts the second capacitor to the first capacitor;
during a second phase, the first switch stops conducting the second capacitor to the first capacitor; and
the first phase lasts for one said sampling period, so as to achieve anti-aliasing when an output signal of the AAF is sampled at said sampling period.

22. The AAF of claim 21 further comprising a first resistor and a second switch, wherein the first resistor is coupled between a front node and the input terminal, the second capacitor is coupled between a first node and a second node, the first switch is coupled between the first node and the input terminal, and the second switch is coupled between the second node and the output terminal.

23. An anti-aliasing filter (AAF) for discretization at a sampling period, comprising:
an operational amplifier having an input terminal and an output terminal;
a first capacitor coupled between the input terminal and the output terminal;
a second capacitor; and
a first switch coupled between the first capacitor and the second capacitor; wherein:
during a first phase, the first switch conducts the second capacitor to the first capacitor;
during a second phase, the first switch stops conducting the second capacitor to the first capacitor; and
the AAF further comprises a first resistor coupled between a front node and the input terminal; and
the first phase lasts for one said sampling period, so as to achieve anti-aliasing when an output signal of the AAF is sampled at said sampling period.

24. The AAF of claim 23 further comprising a second switch, wherein the second capacitor is coupled between a first node and a second node, the first switch is coupled between the first node and the input terminal, and the second switch is coupled between the second node and the output terminal.

* * * * *